(12) United States Patent
Hsu et al.

(10) Patent No.: US 11,221,554 B2
(45) Date of Patent: Jan. 11, 2022

(54) EUV MASKS TO PREVENT CARBON CONTAMINATION

(71) Applicant: TAIWAN SEMICONDUCTOR MANUFACTURING CO., LTD., Hsinchu (TW)

(72) Inventors: Pei-Cheng Hsu, Taipei (TW); Ta-Cheng Lien, Hsinchu County (TW); Hsin-Chang Lee, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 131 days.

(21) Appl. No.: 16/746,640

(22) Filed: Jan. 17, 2020

(65) Prior Publication Data

US 2021/0223678 A1 Jul. 22, 2021

(51) Int. Cl.
*G03F 1/24* (2012.01)
*G03F 1/22* (2012.01)

(52) U.S. Cl.
CPC . *G03F 1/24* (2013.01); *G03F 1/22* (2013.01)

(58) Field of Classification Search
CPC ..................................... G03F 1/22; G03F 1/24
USPC ........................................................... 430/5
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 8,927,179 B2 | 1/2015 | Mikami |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 10,877,368 B2 | 12/2020 | Jindal |
| 2010/0266938 A1 | 10/2010 | Hosoya |
| 2013/0071779 A1 | 3/2013 | Hosoya |
| 2014/0154615 A1 | 6/2014 | Yu et al. |
| 2014/0363633 A1 | 12/2014 | Kim et al. |
| 2015/0010854 A1 | 1/2015 | Seo et al. |
| 2015/0147686 A1 | 5/2015 | Lu et al. |
| 2016/0377983 A1 | 12/2016 | Yu et al. |
| 2019/0146331 A1 | 5/2019 | Lin et al. |
| 2021/0033960 A1* | 2/2021 | Hsu .......................... G03F 1/24 |

FOREIGN PATENT DOCUMENTS

| | | |
|---|---|---|
| DE | 10 2019 124 781 A1 | 4/2020 |
| KR | 20100114472 A | 10/2010 |
| KR | 20140144610 A | 12/2014 |
| KR | 20150004168 A | 1/2015 |
| TW | 201730663 A | 9/2017 |
| TW | 201830122 A | 8/2018 |

* cited by examiner

*Primary Examiner* — Christopher G Young
(74) *Attorney, Agent, or Firm* — Maschoff Brennan

(57) ABSTRACT

An extreme ultra-violet (EUV) mask and method for fabricating the same is disclosed. For example, the EUV mask includes a substrate, a multi-layered mirror layer formed on the substrate, a metal capping layer formed on the multi-layered mirror layer, and a multi-layered absorber layer formed on the metal capping layer. The multi-layered absorber layer includes features etched into the multi-layered absorber layer to define structures on a semiconductor device.

20 Claims, 8 Drawing Sheets

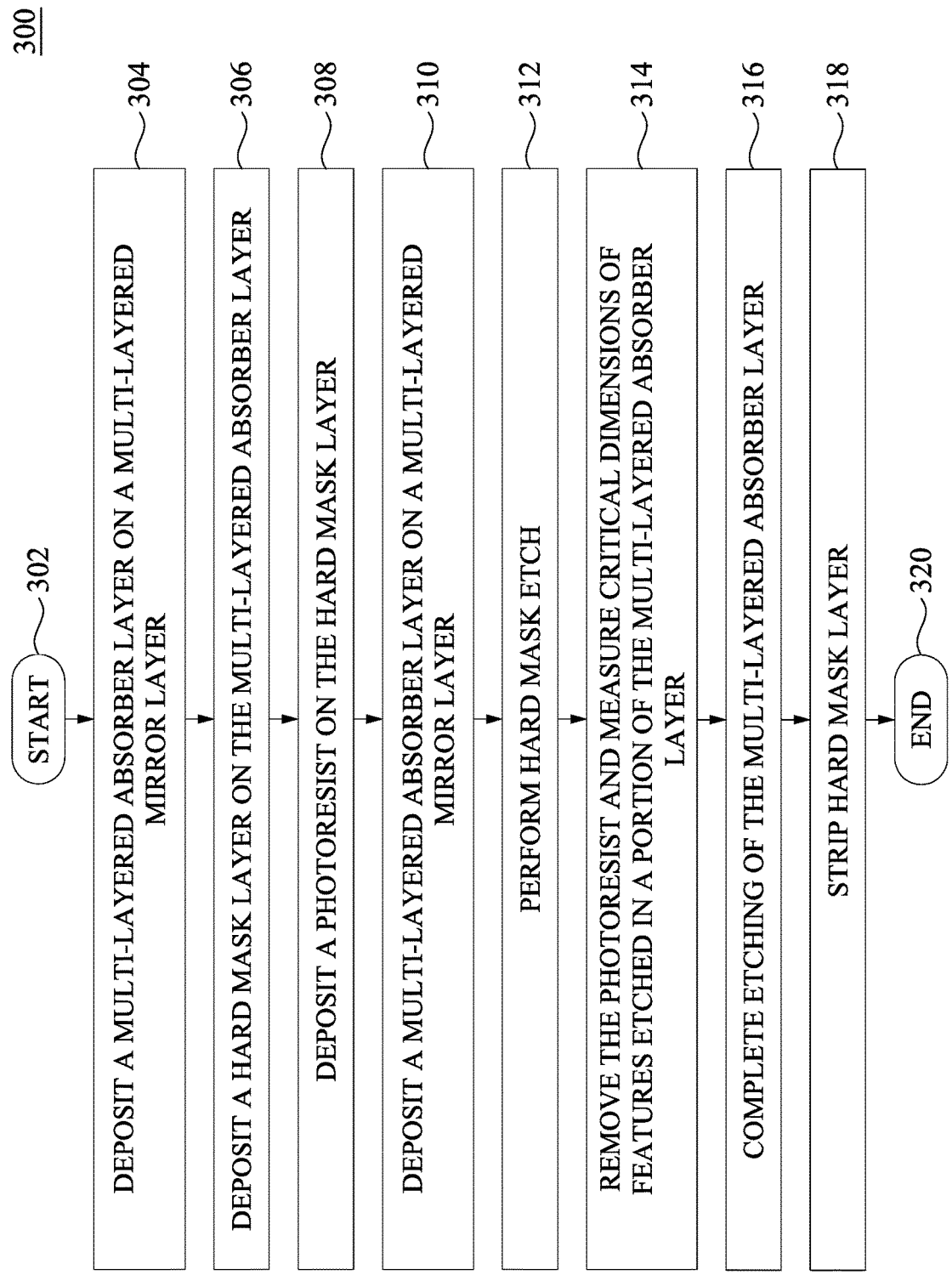

EUV MASKS TO PREVENT CARBON CONTAMINATION

BACKGROUND

Optical lithography may be performed in a variety of different ways. One example of an optical lithography process includes extreme ultra violet (EUV) lithography. EUV lithography is based on exposure with a portion of the electromagnetic spectrum having a wavelength of 10-15 nanometers.

In one example, an EUV mask may be used to define structures within layers of a substrate. EUV masks may be reflective. Thus, a pattern on an EUV mask may be defined by selectively removing an absorber layer to uncover portions of an underlying mirror coated on a substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a flowchart of a method of forming an EUV mask according to at least one embodiment of the present disclosure;

DETAILED DESCRIPTION

Figure 2:
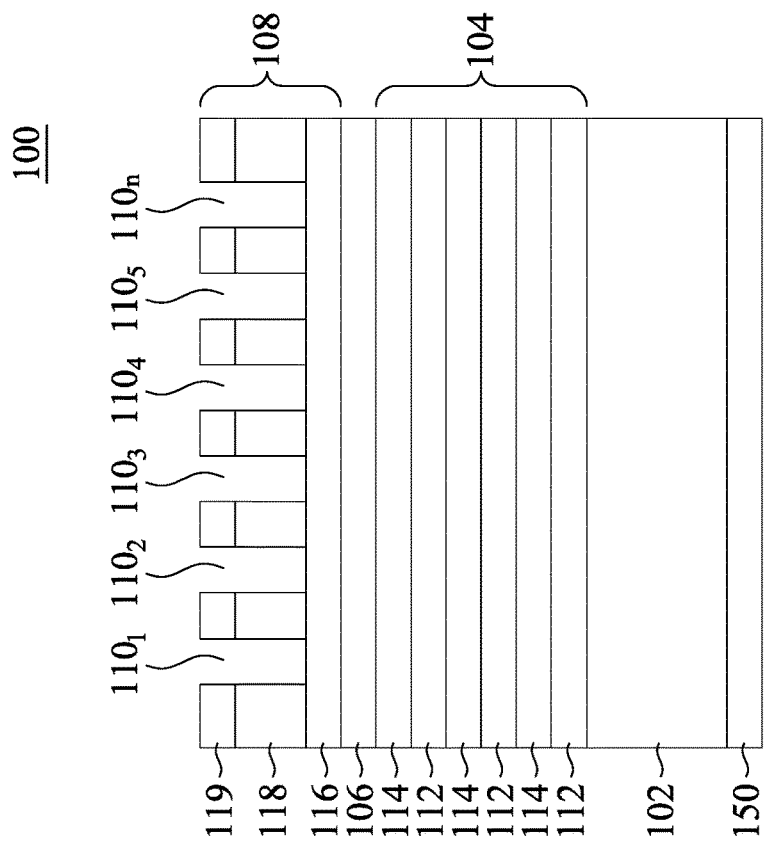
FIG. 2 illustrates a cross-sectional view of the EUV mask with a multi-layered absorber layer according to at least one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is related to various embodiments of an EUV mask that prevents carbon contamination. Carbon contamination can negatively affect the critical dimension of features formed in an absorber layer and a capping layer of the EUV mask. For example, some metal capping layers may have many free radicals that can react with the hydrocarbons near the EUV mask surface during exposure. During exposure, the hydrocarbons can be cracked near the surface of the EUV mask when exposed to high energy. The buildup of carbon on the metal layer can create issues in the wafer critical dimension.

The present disclosure broadly provides a multi-layered absorber layer or multi-layered capping layer in the EUV mask. At least one layer of the EUV mask may include an oxide. The oxide may act as an insulator that minimizes reaction of the absorber layer with hydrocarbons or carbon during wafer printing.

Figure 1:
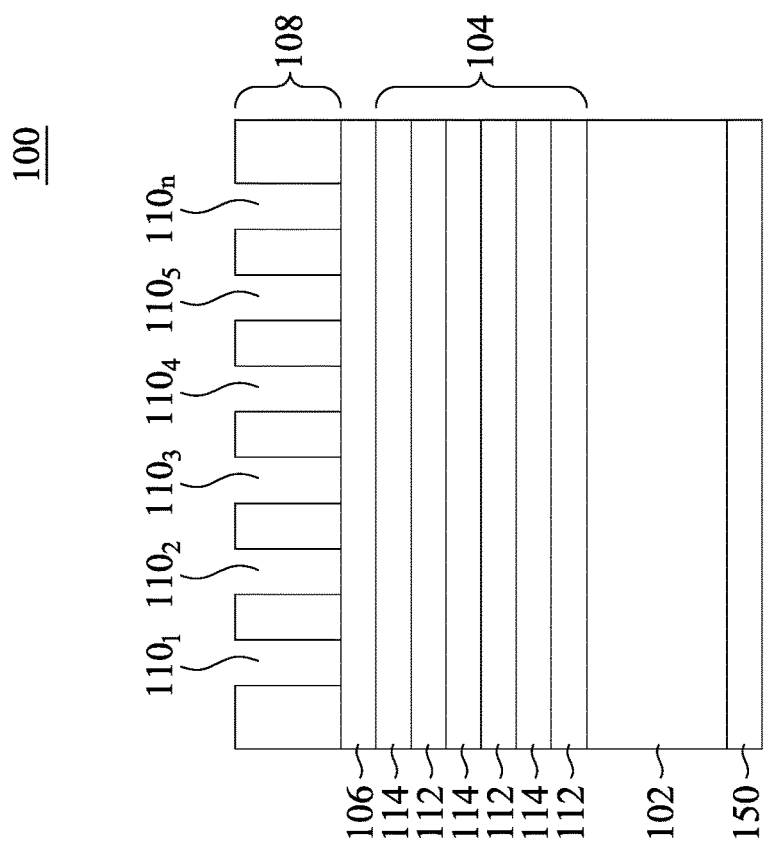
FIG. 1 illustrates a cross-sectional view of an extreme ultra-violet (EUV) mask according to at least one embodiment of the present disclosure.

FIG. 1 illustrates an example of an EUV mask 100 of the present disclosure. The EUV mask 100 may include a substrate 102, a multi-layered (ML) mirror layer 104, a metal capping layer 106, and a multi-layered absorber layer 108. In one embodiment, the substrate 102 may be a low thermal expansion material (LTEM) that is deposited on a layer 150. The layer 150 may be a tantalum boron (TaB) layer or chromium nitride (CrN) layer. The substrate 102 may have a low defect level and a smooth surface. The substrate 102 may be glass, a glass-ceramic material, or silicon.

In one embodiment, the ML mirror layer 104 may include alternating layers of a high index of refraction material 112 and a low index of refraction material 114. In one example, the high index of refraction material 112 may be Molybdenum (Mo) and the low index of refraction material 114 may be Silicon (Si). However, it should be noted that any types of materials can be used. In one embodiment, 40 pairs of the high index of refraction material 112 and the low index of refraction material 114 may be formed on the substrate 102. However, it should be noted that any number of pairs can be deployed in the ML mirror layer 104.

The thickness of the high index of refraction material 112 and the low index of refraction material 114 may be a function of an illumination wavelength that is selected and an incidence angle of the illumination light. In one embodiment, the thickness of the high index of refraction material 112 and the low index of refraction material 114 may be selected to maximize the constructive interference of the EUV light reflected at each interface and to minimize the overall absorption of the EUV light.

In one embodiment, the thickness of the high index of refraction material 112 and the low index of refraction material 114 may be approximately one quarter of the illumination wavelength. For example, if the wavelength is 10 nanometers (nm), the thickness of the high index of refraction material 112 and the low index of refraction material 114 may each be approximately 2.5 nm. In one embodiment, the thickness of the high index of refraction material 112 and the low index of refraction material 114 may be different.

In one embodiment, a metal capping layer 106 may be deposited on top of the last layer of the ML mirror layer 104. The metal capping layer 106 may prevent oxidation of the high index of refraction material 112 (e.g., Mo) by exposure to the environment. In one embodiment, the metal capping layer 106 may comprise ruthenium (Ru) or ruthenium oxide ($RuO_2$). The metal capping layer 106 may be deposited with a thickness of approximately 2.5-5.5 nm. In one embodiment, the metal capping layer 106 may be deposited with a thickness of approximately 3.5 nm.

In one embodiment, the multi-layered absorber layer 108 may comprise multiple layers including an oxide containing absorber layer. In other words, the multi-layered absorber layer 108 may include at least one layer that contains an oxide. The oxide may act as an insulator to prevent carbon contamination. For example, the oxide may minimize reaction layers of the multi-layered absorber layer 108 with hydrocarbons or carbon that is produced during printing of the multi-layered absorber layer 108. The hydrocarbons can contaminate the capping layer which may impact the critical dimension of the wafer. Further details of the different layers are illustrated in FIG. 2 and discussed in further details below.

In one embodiment, the multi-layered absorber layer 108 may include features $110_1$ to $110_n$ (hereinafter also referred to individually as a feature 110 or collectively as features 110). The features 110 may be etched into the multi-layered absorber layer 108. The features 110 may define areas where EUV light may pass through to the ML mirror layer 104 to define structures in a semiconductor device.

As noted above, some metal capping layers may have free radicals that can react with hydrocarbons near the EUV mask surface during exposure to the EUV light. The hydrocarbons may be cracked into carbon. The aliphatic hydrocarbons or aromatic hydrocarbons may be directly deposited on the metal capping layer 106. The carbon or hydrocarbon on the metal capping layer 106 can create issues in the critical dimensions (CD) of the features on the wafer. For example, carbon or hydrocarbon contamination can create CD drift including proximity trends or CD uniformity changes. These issues can negatively affect the performance of the EUV mask 100.

The present disclosure provides the multi-layered absorber layer 108 that may include oxides to eliminate carbon contamination and improve CD uniformity in the features 110. The oxide layer or layers in the multi-layered absorber layer 108 may act as an insulator that does not react with the carbon or hydrocarbons during exposure to EUV light. The oxides may also prevent the carbon or hydrocarbons from reacting with the free radicals in the metal capping layer 106.

FIG. 2 illustrates a more detailed view of the multi-layered absorber layer 108 in the EUV mask 100. The EUV mask 100 illustrated in FIG. 2 may include the same layers and be fabricated the same way as the EUV mask 100 illustrated in FIG. 1. For example, FIG. 2 illustrates the EUV mask 100 with the substrate 102 on the TaB layer 150, the ML mirror layer 104, the metal capping layer 106, and the multi-layered absorber layer 108. The dimensions of the ML mirror layer 104 and the metal capping layer 106 may be similar to the dimensions described above with respect to FIG. 1.

In one embodiment, the multi-layered absorber layer 108 may be an oxide based absorber layer that includes a first metal oxide layer 116, a metal nitride layer 118, and a second metal oxide layer 119. The metal nitride layer 118 may be located between the first metal oxide layer 116 and the second metal oxide layer 119. In one embodiment, the first metal oxide layer 116 and the second metal oxide layer 119 may be the same material. In one embodiment, the first metal oxide layer 116 and the second metal oxide layer 119 may be different materials.

In one embodiment, the metal nitride layer 118 may be thicker than the first metal oxide layer 116 and the second metal oxide layer 119. In one embodiment, the first metal oxide layer 116 may have a thickness that is approximately the same as a thickness of the second metal oxide layer 119.

Notably, the oxide layers are part of the absorber layer and not formed as a separate buffer layer as described by other EUV masks and methods. Furthermore, the multi-layered absorber layer 108 may include metal oxide layers that surround, on both sides or opposite sides, the metal nitride layer of the multi-layered absorber layer 108.

In one embodiment, the first metal oxide layer 116 may have a thickness of approximately 0 nm-5.5 nm depending on the material of the first metal oxide layer. In one embodiment, the first metal oxide layer 116 may comprise tantalum boro-oxide (TaBO). The TaBO may be deposited to have a thickness of approximately 0 nm-2 nm.

In one embodiment, the first metal oxide layer 116 may comprise tantalum pentoxide ($Ta_2O_5$). The $Ta_2O_5$ may be deposited to have a thickness of approximately 1 nm-2 nm.

In one embodiment, the first metal oxide layer 116 may comprise ruthenium oxide ($RuO_2$). The RuO may be deposited to have a thickness of approximately 0 nm-5.5 nm.

In one embodiment, the first metal oxide layer 116 may comprise ruthenium niobium oxide (RuNbO). The RuNbO may have greater than 20 atom percent of Nb. The RuNbO may be deposited to have a thickness of approximately 0 nm-5.5 nm.

In one embodiment, the first metal oxide layer 116 may comprise niobium pentoxide ($Nb_2O_5$). The $Nb_2O_5$ may be deposited to have a thickness of approximately 0 nm-5.5 nm.

In some embodiments, the metal capping layer 106 may be optional depending on the material. For example, the metal capping layer 106 may comprise $RuO_2$, RuNbO, or $Nb_2O_5$.

In one embodiment, the metal nitride layer 118 may comprise tantalum boro-nitride (TaBN). The TaBN may be deposited to have a thickness between 60 nm-75 nm. In one embodiment, the TaBN may be deposited to have a thickness of approximately 66 nm-67 nm.

In one embodiment, when the first metal oxide layer 116 comprises TaBO, the TaBO may have a thickness of approximately 1 nm-2 nm. The thickness may allow a small amount of TaBO to remain on the metal capping layer 106 during etching of the multi-layered absorber layer 108. For example, after the multi-layered absorber layer 108 is etched less than 1 nm of the TaBO may remain on the metal capping layer 106. The thickness of the TaBO may reduce the over etch time of the metal nitride layer 118 by approximately 30 percent.

In one embodiment, the second metal oxide layer may comprise TaBO. The TaBO may be deposited to have a thickness of approximately 1 nm-5 nm. In one embodiment, the TaBO may be deposited to have a thickness of approximately 2 nm.

In one embodiment, the features 110 may be etched into the metal nitride layer 118 of the multi-layered absorber layer 108 via a photolithography process, followed by a main etch and an over etch process. For example, a hard mask may be deposited on the multi-layered absorber layer 108. A photoresist may be spun onto the hard mask. An electron beam write or laser beam writer may be used to define the features 110. Portions of the photoresist that are not covered by the patterned mask may be exposed to a radiation light source or ultraviolet light source and developed. The pattern may be transferred into the hard mask and the features 110 may then be etched into the multi-layered absorber layer 108. The hard mask, remaining photoresist, and patterned mask may be removed. FIGS. 4A-4J illustrate further details of the above process. In one embodiment, the main etch and the over etch may be performed via an ion etch or a dry etch in the presence of various gases.

In one embodiment, the main etch may performed via an ion etch over 30-50 seconds (s) with a source power of approximately 100-500 Watts (W) and a bias power of approximately 5-30 W at a pressure of approximately 1-3 milliTorr (mTorr). The ion etch may be performed in the presence of chlorine gas ($Cl_2$) at 50-150 standard cubic centimeters per minute (sccm) and Helium (He) gas at 10-100 sccm. In one embodiment, the main etch may be performed via an ion etch in approximately 35 s with a source power of approximately 300 W and a bias power of approximately 15 W at a pressure of approximately 2 mTorr. The etch may be performed in the presence of $Cl_2$ gas at approximately 100 sccm and He gas at approximately 60 sccm. It should be noted that the values provided above are one example of values or value ranges that can be applied to etch the multi-layered absorber layer 108.

In one embodiment, the over etch may be performed via an ion etch at approximately 30 percent of the main etch time. Similar ranges for the source power, the bias power, the pressure, the flow of $Cl_2$ gas, and He gas may be used for the over etch.

In one embodiment, the features 110 may be etched into the metal nitride layer 118 of the multi-layered absorber layer 108 by pulsing the source power. In other words, the source power may be turned on and off in a pulsing fashion to etch the features 110 into the multi-layered absorber layer 108.

FIG. 3 illustrates a flowchart of a method 300 of forming an EUV mask according to at least one embodiment of the present disclosure. The method 300 may be performed via one or more different tools within a fabrication plant under the control of controller or processor.

While the method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The method 300 begins at block 302. At block 304, the method 300 deposits a multi-layered absorber layer on a multi-layered mirror layer. The multi-layered absorber layer may include at least one oxide layer or oxides that may prevent carbon contamination that can adversely affect the critical dimensions of features formed in the multi-layered absorber layer. The multi-layered absorber layer may include a first metal oxide layer, a metal nitride layer, and a second metal oxide layer.

At block 306, the method 300 deposits a hard mask layer on the multi-layered absorber layer. The hard mask layer may serve as an etch stop when a subsequent photo resist layer is removed. The hard mask layer may be a metal-oxy-nitride compound. In one embodiment, the hard mask layer may be a chromium oxynitride (CrON), chromium nitride (CrN), chromium carbon oxynitride (CrCON), and the like. The hard make layer may be deposited to have a thickness of approximately 3-10 nm.

At block 308, the method 300 deposits a photoresist on the hard mask layer. The photoresist may be spun onto the hard mask layer. The photoresist may be a radiation-sensitive layer that may be coated onto the hard mask layer. The photoresist may be deposited to have a thickness of approximately 100-1000 nm.

At block 310, the method 300 performs an exposure, a post exposure bake, and develop of the photo resist. For example, an electron beam write or a laser beam writer may be used to define a pattern on the photoresist. The photoresist may then be processed via a post exposure bake and develop.

After the photoresist is developed, critical dimensions of the features in the photoresist may be measured. After measurement, the features in the photoresist may be transferred to the multi-layered absorber layer using the following blocks of the method 300.

At block 312, the method 300 may perform a hard mask etch. For example, the features developed into the photoresist may define the portions of the hard mask layer that may be etched. The select portions of the hard mask layer may then be etched. In one embodiment, a dry etch, a wet etch, or a combination of both may be used to perform the etch.

At block 314, the method 300 removes the photoresist and measures critical dimensions of the features etched in a portion of the multi-layered absorber layer. In one embodiment, any type of measurement or metrology tool may be used to measure the critical dimensions. For example, a critical dimension scanning electron microscope (CD-SEM) tool may be used.

At block 316, the method 300 completes etching of the multi-layered absorber layer. The multi-layered absorber layer may be etched via an ion etch process or a dry etch process. Example process parameters for an ion etch process are provided above. In one embodiment, the ion etch may be performed by pulsing the power source on and off.

At block 318, the method 300 strips the hard mask layer. The hard mask layer may be selectively etched off of the multi-layered absorber layer. For example, a wet etch process or a dry etch process may be used to remove the hard mask layer. The remaining structure after the hard mask layer is removed may be the EUV mask of the present disclosure with the multi-layered absorber layer. As noted above, the multi-layered absorber layer may include oxides that prevent carbon contamination. At block 320, the method 300 ends.

Figure 4B:
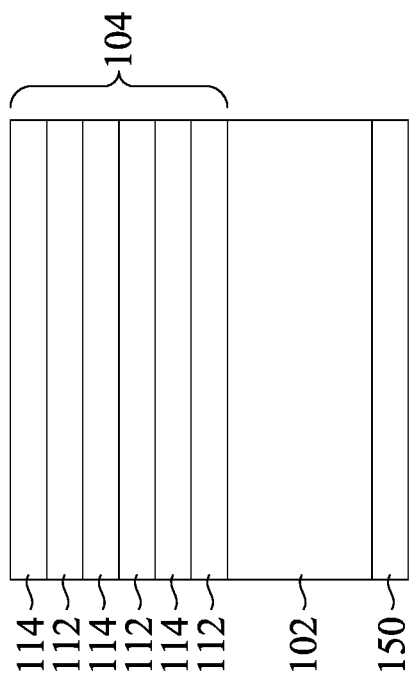
FIGS. 4A-4J are partial cross-sectional views of the EUV mask at various stages of manufacture in accordance with at least one embodiment of the present disclosure.
Figure 4A:
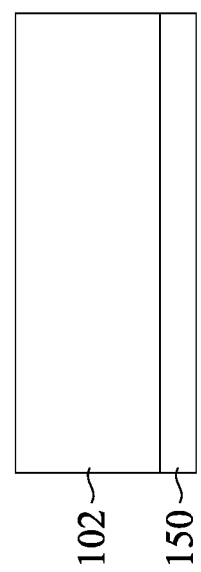

FIGS. 4A-4J illustrate a plurality of partial cross-sectional views illustrating one embodiment of a method of forming the EUV mask at various stages of manufacture in accordance with at least one embodiment of the present disclosure. Referring to FIG. 4A, a substrate 102 is provided. The substrate 102 may be a low thermal expansion material (LTEM). Examples of LTEMs may include glass, a glass-ceramic material, or silicon. The substrate 102 may be deposited on the layer 150. The layer 150 may be a TaB layer or a CrN layer.

In FIG. 4B, a multi-layered mirror layer 104 may be deposited or formed on the substrate 102. In one embodiment, the multi-layered mirror layer 104 may be formed on the substrate 102 via ion beam deposition (IBD) or direct current (DC) magnetron sputtering.

The multi-layered mirror layer 104 may include alternating layers of a high index of refraction material 112 and a low index of refraction material 114. In one embodiment, the high index of refraction material 112 may be Mo and the low index of refraction material 114 may be Si.

The multi-layered mirror layer 104 may have between 20-60 pairs of the high index of refraction material 112 and the low index of refraction material 114. In one embodiment, the multi-layered mirror layer 104 may include 40 pairs of the high index of refraction material 112 and the low index of refraction material 114.

Figure 4D:
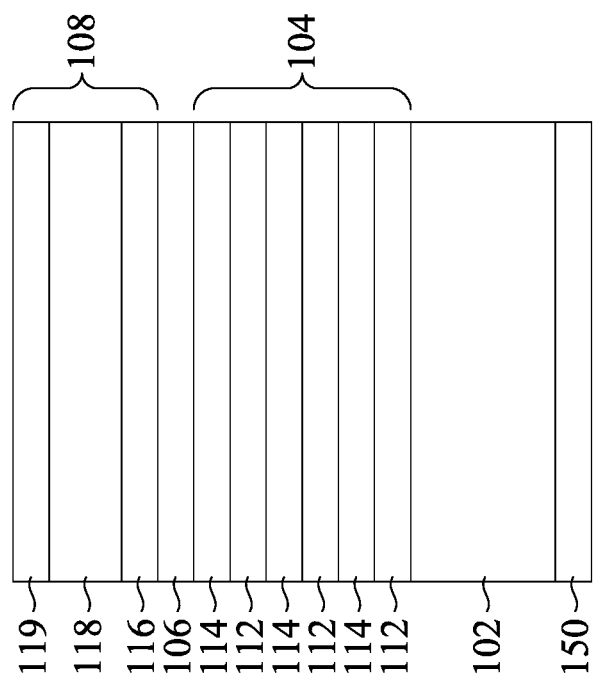
Figure 4C:
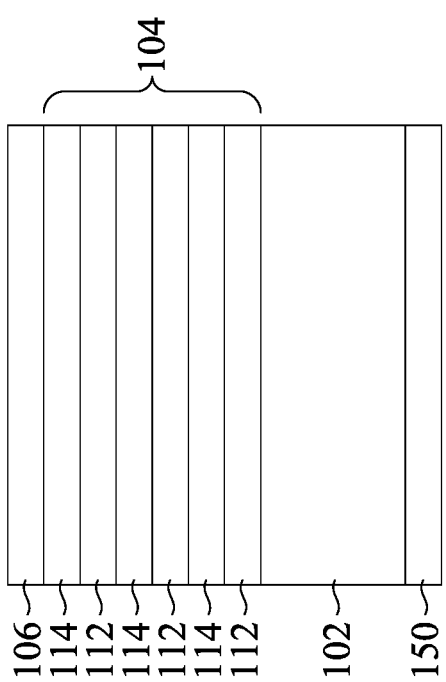

In FIG. 4C, a metal capping layer 106 may be deposited on the multi-layered mirror layer 104. In one embodiment, the metal capping layer 106 may be deposited via an ion beam sputtering process. In one embodiment, the metal capping layer 106 may be optional depending on the materials used for the multi-layered absorber layer 108 illustrated in FIG. 4D, and discussed below.

In one embodiment, the metal capping layer 106 may prevent oxidation of the high index of refraction material 112 (e.g., Mo) by exposure to the environment. The metal capping layer 106 may comprise a material that has a slower etching rate than the multi-layered absorber layer 108, illustrated in FIG. 4D, and discussed below. As a result, the metal capping layer 106 may protect the multi-layered mirror layer 104 when the multi-layered absorber layer 108 is patterned via an etch process.

In one embodiment, the metal capping layer 106 may comprise ruthenium (Ru), ruthenium oxide ($RuO_2$), or ruthenium niobium oxide (RuNbO), niobium pentoxide ($Nb_2O_5$), and the like. The metal capping layer 106 may be deposited with a thickness of approximately 2.5-5.5 nm. In one embodiment, the metal capping layer 106 may be deposited with a thickness of approximately 3.5 nm.

In FIG. 4D, the multi-layered absorber layer 108 is formed over the multi-layered mirror layer 104. In some embodiments where the metal capping layer 106 is deposited, the multi-layered absorber layer 108 may be formed on the metal capping layer 106.

In one embodiment, the multi-layered absorber layer 108 may include a first metal oxide layer 116, a metal nitride layer 118, and a second metal oxide layer 119. The layers of the multi-layered absorber layered 108 may be deposited or formed via a chemical vapor deposition (CVD) or an ion beam sputtering process one layer at a time.

In one embodiment, the first metal oxide layer 116 may comprise tantalum boro-oxide (TaBO), tantalum pentoxide ($Ta_2O_5$), ruthenium oxide ($RuO_2$), ruthenium niobium oxide (RuNbO), or niobium pentoxide ($Nb_2O_5$). When the first metal oxide layer 116 comprises TaBO or $Ta_2O_5$ the metal capping layer 106 may be deposited. When the first metal oxide layer 116 comprises RuO, RuNbO, or $Nb_2O_5$ the metal capping layer 106 may be removed or the process associated with FIG. 4C may be skipped.

In one embodiment, the metal nitride layer 118 may comprise tantalum boro-nitride (TaBN). In one embodiment, the second metal oxide layer 119 may comprise TaBO.

As discussed above, the oxide in the first metal oxide layer 116 and the second metal oxide layer 119 may act as insulators that prevent carbon contamination in the edges and center of the features of the multi-layered absorber layer 108. The carbon contamination may adversely affect the critical dimensions of the features that are formed in the multi-layered absorber layer 108.

In addition, when the first metal oxide layer 116 is TaBO, the TaBO may be deposited to have a desired thickness that may reduce the over etch time. For example, the desired thickness may allow a small amount of the TaBO to remain on the metal capping layer 106. For example, the TaBO may be deposited to have a thickness of approximately 1-2 nm such that approximately less than 1 nm of the TaBO remains on the metal capping layer 106 after the multi-layered absorber layer 108 is etched.

Figure 4F:
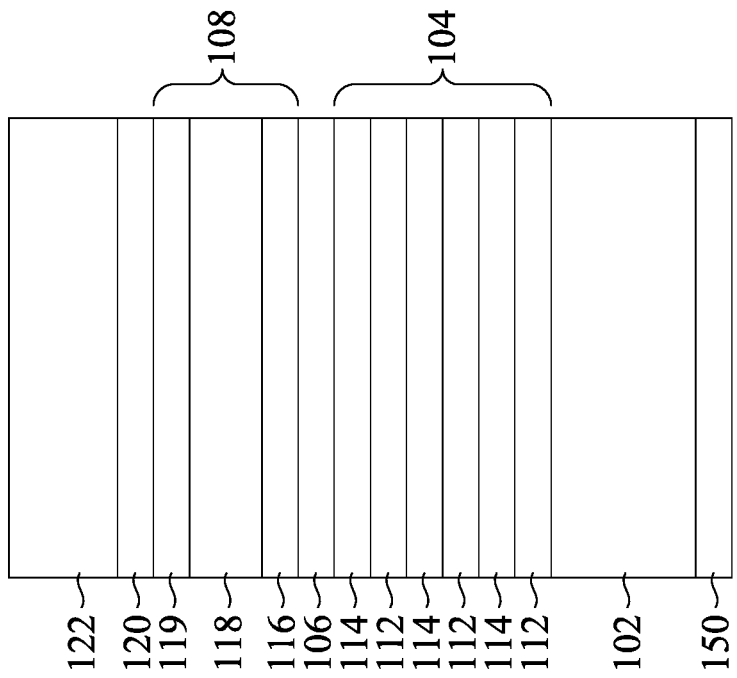
Figure 4E:
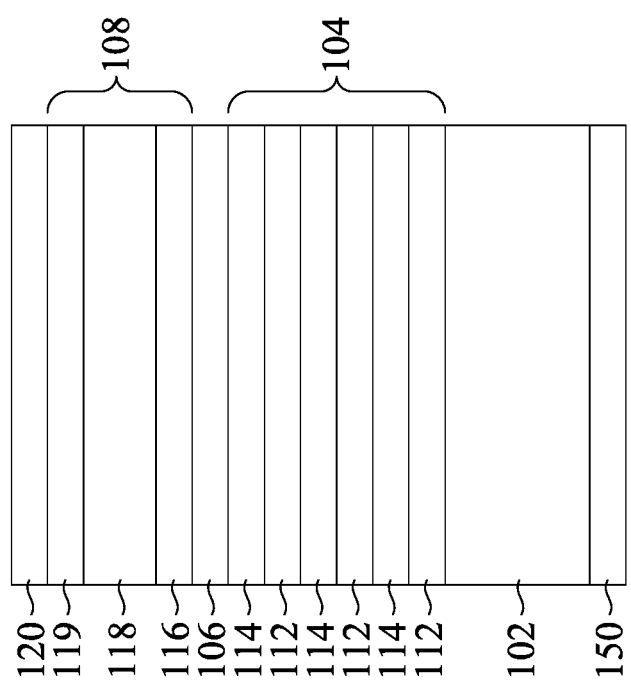

In FIG. 4E, a hard mask layer 120 may be deposited on to the multi-layer absorber layer 108. In one embodiment, the hard mask layer 120 may be deposited via a CVD process. The hard mask layer 120 may serve as an etch stop when a subsequent photo resist layer is removed. The hard mask layer 120 may be a metal-oxy-nitride compound. In one embodiment, the hard mask layer 120 may be a chromium oxynitride (CrON) that may be deposited to have a thickness of approximately 6 nm.

In FIG. 4F, photoresist 122 may be deposited onto the hard mask layer 120. The photoresist 122 may be coated onto the hard mask layer 120, exposed, baked, and developed with a pattern of features that may eventually be transferred to the multi-layered absorber layer 108.

Figure 4H:
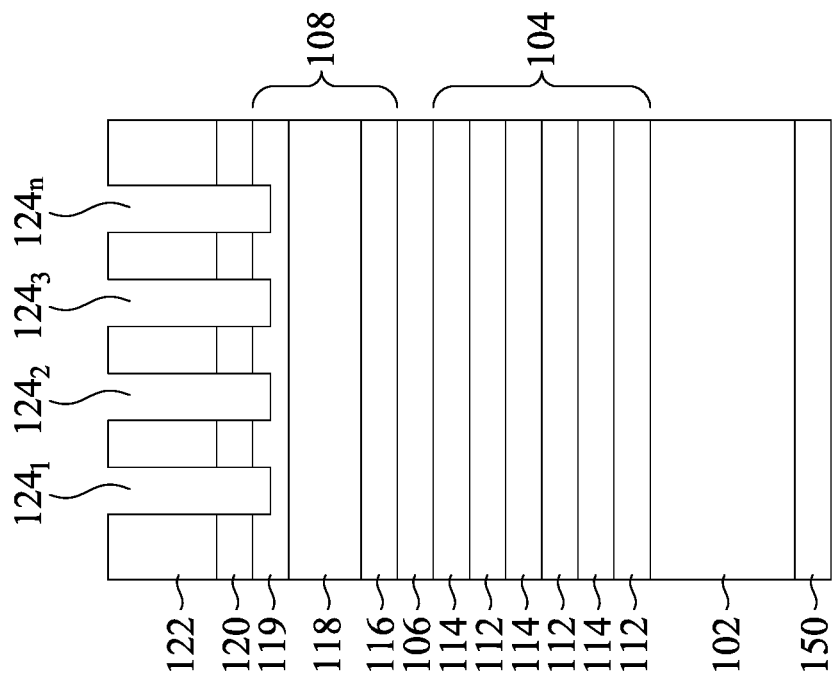
Figure 4G:
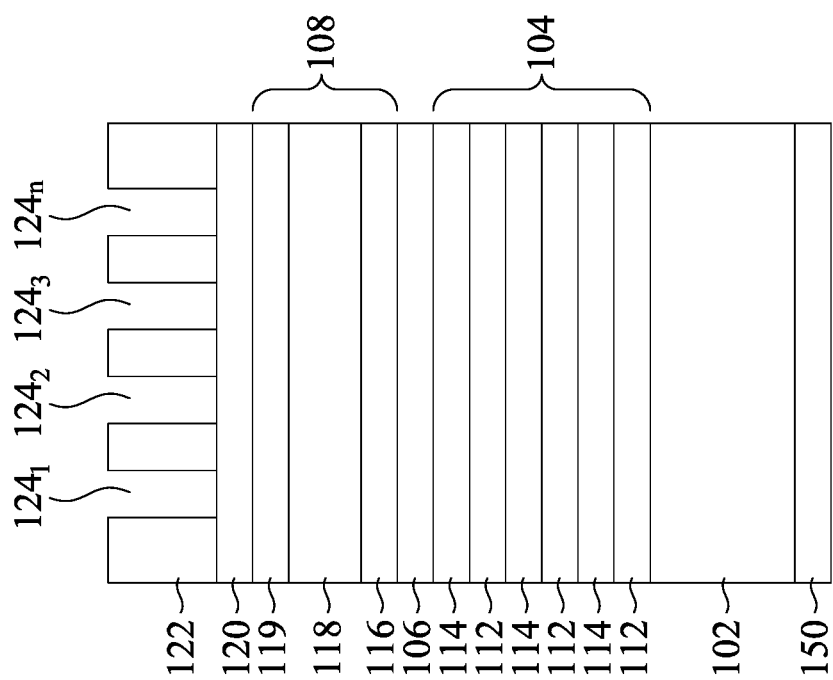

In FIG. 4G, the photoresist 122 may be etched to create the features $124_1$-$124_n$ (hereinafter also referred to individually as features 124 or collectively as features 124) that were patterned into the photoresist 122 in FIG. 4F. The features 124 may correspond to the features 110 etched into the multi-layered absorber layer 108 as illustrated in FIG. 4I, and discussed in further details below.

In FIG. 4H, the etching process may continue to etch the features 124 through the hard mask layer 120 and into the multi-layered absorber layer 108. In one example, the etching process in FIG. 4H may use a reactive ion etch or a dry etch. In one embodiment, a reactive ion etch is used with the parameters described above.

In one embodiment, after the features 124 are partially etched into the multi-layered absorber layer 108, the critical dimensions of the features 124 may be measured. If the measurement of the critical dimensions of the features 124 meets the desired critical dimensions, then the features 124 may be etched through the multi-layered absorber layer 108.

Figure 4J:
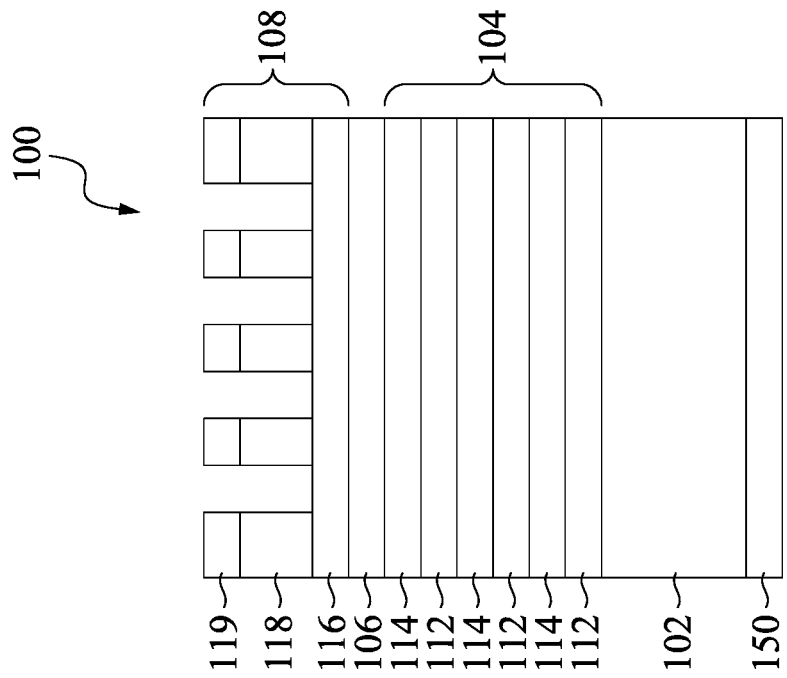
Figure 4I:
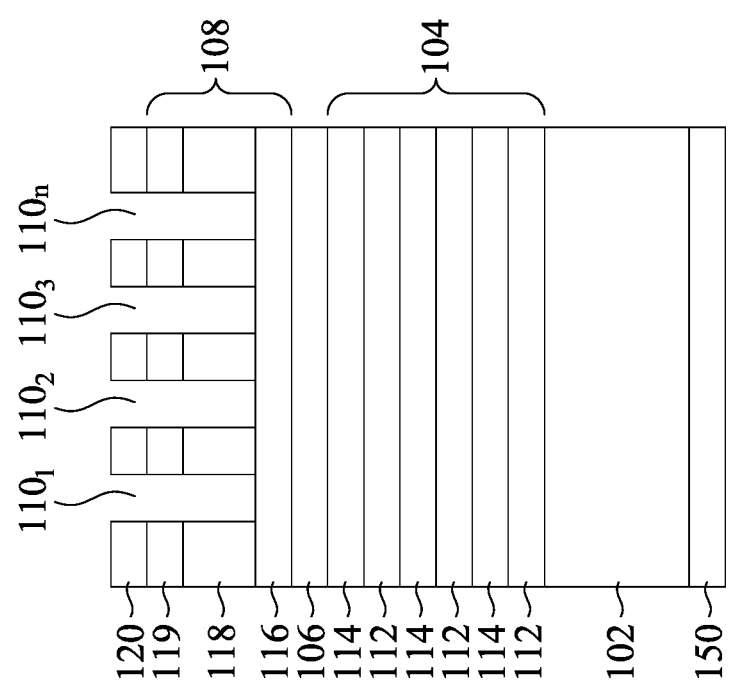

In FIG. 4I, the features $110_1$ to $110_n$ may be formed through the multi-layered absorber layer 108 leaving a portion of the first metal oxide layer 116 on the metal capping layer 106. FIG. 4I illustrates the hard mask layer 120 without the photoresist 122 that has been removed. The photo resist 122 may be etched away as the features 110 are etched into the multi-layered absorber layer 108. In one embodiment, the features 110 may be etched into the multi-layered absorber layer 108 by pulsing the power source during a reactive ion etch process.

In one embodiment, the features 110 may be used to define structures in a semiconductor device. For example, the EUV mask 100 may be used to create structures in accordance with the pattern of features 110 etched into the multi-layered absorber layer 108. An example of a lithography system that can use the EUV mask 100 and the process to create structures is illustrated in FIG. 5 and discussed in further details below.

In FIG. 4J, the hard mask layer 120 may be stripped away resulting in the final EUV mask 100 that is formed in accordance with at least one embodiment of the present disclosure. The hard mask layer 120 may be selectively etched off of the multi-layered absorber layer 108. For example, a wet etch process or a dry etch process may be used to remove the hard mask layer 120.

Figure 5:
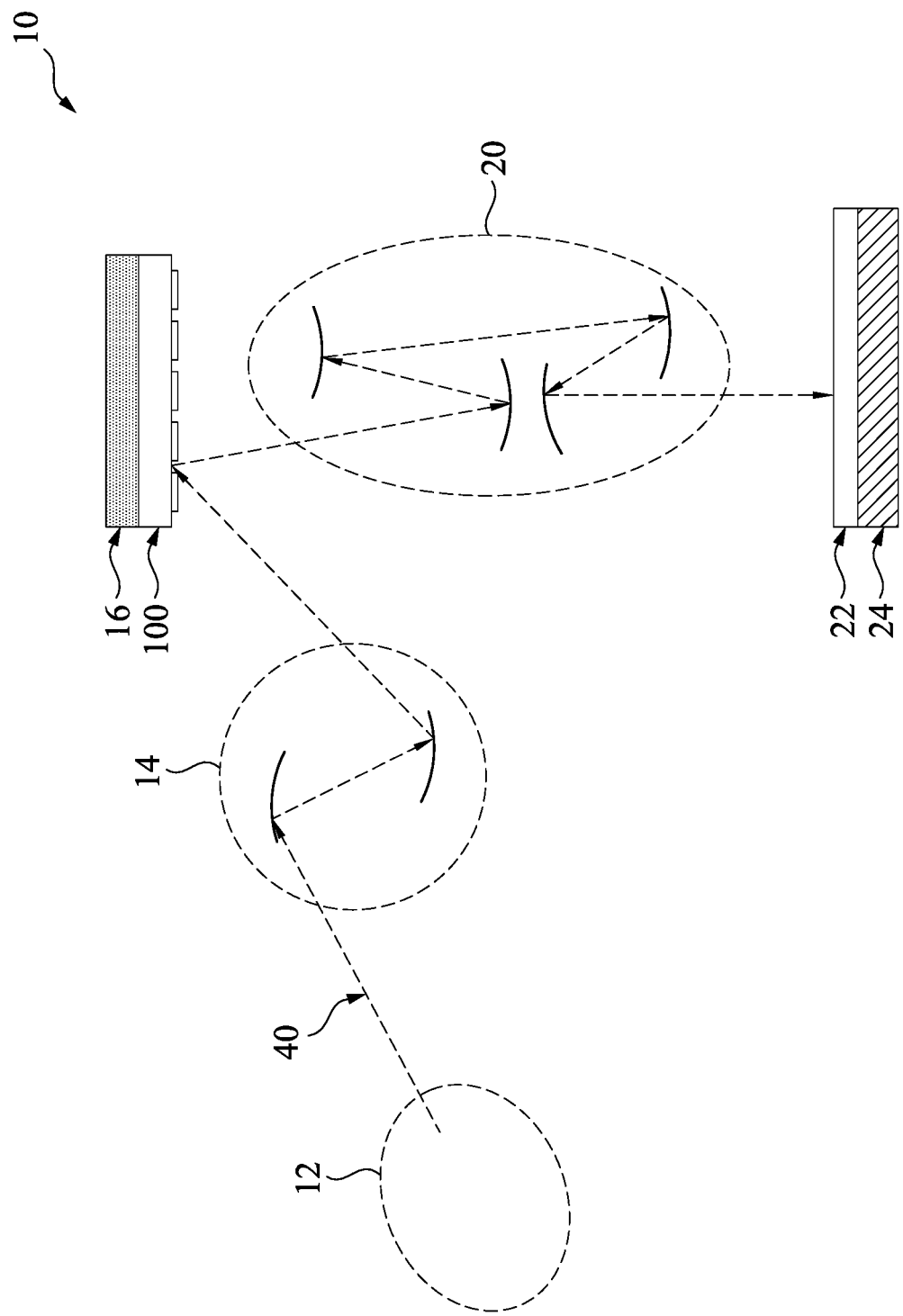
FIG. 5 illustrates a schematic view of an example EUV lithography system that uses the EUV mask of the present disclosure.

FIG. 5 illustrates a schematic view of a lithography system 10 that describes a process of how the EUV mask 100 may be used in such a lithography system. The lithography system 10 may also be generically referred to as a scanner that is operable to perform lithography exposure processes. In the present embodiment, the lithography system 10 is an extreme ultraviolet (EUV) lithography system designed to expose a resist layer by EUV light (or EUV radiation). The resist layer is a material sensitive to the EUV light. The EUV lithography system 10 employs a radiation source 12 to generate EUV light 40, such as EUV light having a wavelength ranging between about 1 nm and about 100 nm. In one particular example, the EUV light 40 has a wavelength centered at about 13.5 nm. Accordingly, the radiation source 12 is also referred to as EUV radiation source 12. The EUV radiation source 12 may utilize a mechanism of laser-produced plasma (LPP) to generate the EUV radiation, which will be further described later.

The lithography system 10 also employs an illuminator 14. In some embodiments, the illuminator 14 includes various reflective optics such as a single mirror or a mirror system having multiple mirrors in order to direct the light 40 from the radiation source 12 onto a mask stage 16, particularly to a mask 18 secured on the mask stage 16.

The lithography system 10 also includes the mask stage 16 configured to secure the EUV mask 100. In some embodiments, the mask stage 16 includes an electrostatic chuck (e-chuck) to secure the EUV mask 100. In the present disclosure, the terms mask, photomask, and reticle are used interchangeably. In the present embodiment, the lithography system 10 is a EUV lithography system. The EUV mask 100 may be fabricated as described above.

The lithography system 10 also includes a projection optics module (or projection optics box (POB)) 20 for imaging the pattern of the EUV mask 100 on to a semiconductor substrate 22 secured on a substrate stage (or wafer stage) 24 of the lithography system 10. The POB 20 includes reflective optics in the present embodiment. The light 40 directed from the EUV mask 100, carrying the image of the pattern defined on the EUV mask 100, is collected by the POB 20. The illuminator 14 and the POB 20 may be collectively referred to as an optical module of the lithography system 10.

In the present embodiment, the semiconductor substrate 22 is a semiconductor wafer, such as a silicon wafer or other type of wafer to be patterned. The semiconductor substrate 22 is coated with a resist layer sensitive to the EUV light 40 in the present embodiment. Various components including those described above are integrated together and are operable to perform lithography exposing processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Therefore, the present disclosure relates to an EUV mask and a method for forming the same. In some embodiments, the present disclosure relates to an EUV mask that prevents carbon contamination. The EUV mask comprises a multi-layered mirror that is formed on the substrate. A multi-layered absorber layer is formed over the multi-layered mirror layer. The multi-layered absorber layer comprises features that are etched into the multi-layered absorber layer to define structures on a semiconductor device.

In other embodiments, the present disclosure relates to an EUV mask that includes an oxide containing absorber layer to prevent carbon contamination. The EUV mask comprises a multi-layered mirror that is formed on the substrate. An oxide containing absorber layer is formed over the multi-layered mirror layer. The oxide containing absorber layer comprises features that are etched into the oxide containing absorber layer to define structures on a semiconductor device.

In yet other embodiments, the present disclosure relates to a method for forming the EUV mask that prevents carbon contamination. The method comprises depositing a multi-layered absorber layer on a multi-layered mirror layer. In some embodiments, a metal capping layer may be deposited between the multi-layered absorber layer and the multi-layered mirror layer. A hard mask layer is deposited on the multi-layered absorber layer. Photoresist is coated on the hard mask layer. An exposure, post exposure bake, and develop of the photo resist is performed. The hard mask layer is etched with the features developed in the photoresist. The photoresist is removed and the multi-layered absorber layer is etched to form features in the multi-layered absorber layer to define structures on a semiconductor device. Then the hard mask layer is removed.

What is claimed is:

1. An extreme ultra-violet (EUV) mask, comprising:
a substrate;
a multi-layered mirror layer formed on the substrate;
a metal capping layer formed on the multi-layered mirror layer; and
a multi-layered absorber layer comprising at least one oxide layer formed over the multi-layered mirror layer, wherein the multi-layered absorber layer comprises features etched into the multi-layered absorber layer to define structures on a semiconductor device.

2. The EUV mask of claim 1, wherein the substrate comprises a low thermal expansion material.

3. The EUV mask of claim 1, wherein the multi-layered absorber layer comprises a first metal oxide layer, a metal nitride layer, and a second metal oxide layer.

4. The EUV mask of claim 3, wherein the first metal oxide layer comprises at least one of: Tantalum Boro-oxide (TaBO), Tantalum Pentoxide ($Ta_2O_5$), Ruthenium oxide (RuO), Ruthenium Niobium Oxide (RuNbO), or Niobium Pentoxide ($Nb_2O_5$).

5. The EUV mask of claim 4, wherein the first metal oxide layer comprises TaBO having a thickness of approximately 1-2 nanometers.

6. The EUV mask of claim 4, wherein the metal capping layer comprises TaBO or $Ta_2O_5$.

7. The EUV mask of claim 6, wherein the metal capping layer comprises Ruthenium (Ru) or Ruthenium oxide (RuO).

8. The EUV mask of claim 7, wherein the metal capping layer has a thickness of approximately 0-4 nanometers.

9. The EUV mask of claim 3, wherein the metal nitride layer comprises a Tantalum Boro-nitride (TaBN).

10. The EUV mask of claim 3, wherein the second metal oxide layer comprises Tantalum Boro-oxide (TaBO).

11. An extreme ultra-violet (EUV) mask, comprising:
a substrate;
a multi-layered mirror layer formed on the substrate;

a metal capping layer formed on the multi-layered mirror layer; and an oxide containing absorber layer formed over the multi-layered mirror layer, wherein the oxide containing absorber layer comprises features etched into the oxide containing absorber layer to define structures on a semiconductor device.

12. The EUV mask of claim 11, wherein the metal capping layer comprises Ruthenium (Ru) or Ruthenium oxide (RuO) having a thickness of approximately 0-4 nanometers.

13. The EUV mask of claim 11, wherein the oxide containing absorber layer comprises a first layer of Tantalum Boro-oxide (TaBO), a layer of Tantalum Boro-nitride (TaBN), and a second layer of Tantalum Boro-oxide (TaBO) formed on a metal capping layer.

14. The EUV mask of claim 11, wherein the oxide containing absorber layer comprises a layer of Tantalum Boro-oxide (TaBO), a layer of Tantalum Boro-nitride (TaBN), and a layer of Tantalum Pentoxide ($Ta_2O_5$) formed on a metal capping layer.

15. The EUV mask of claim 11, wherein the oxide containing absorber layer comprises a layer of Tantalum Boro-oxide (TaBO), a layer of Tantalum Boro-nitride (TaBN), and a layer of Ruthenium oxide (RuO).

16. The EUV mask of claim 11, wherein the oxide containing absorber layer comprises a layer of Tantalum Boro-oxide (TaBO), a layer of Tantalum Boro-nitride (TaBN), and a layer of Ruthenium Niobium Oxide (RuNbO).

17. The EUV mask of claim 11, wherein the oxide containing absorber layer comprises a layer of Tantalum Boro-oxide (TaBO), a layer of Tantalum Boro-nitride (TaBN), and a layer of Niobium Pentoxide ($Nb_2O_5$).

18. A method for fabricating an extreme ultra-violet (EUV) mask, comprising:

depositing a multi-layered absorber layer containing at least one oxide layer on a multi-layered mirror layer;

defining features in the multi-layered mirror layer via an expose, bake, and develop process of photoresist coated on a hard mark layer; and etching the multi-layered absorber layer to form the features in the multi-layered absorber layer to define structures on a semiconductor device.

19. The method of claim 18, wherein the multi-layered absorber layer comprises layer of a first metal oxide layer, a layer of Tantalum Boro-nitride (TaBN), and Tantalum Boro-oxide (TaBO).

20. The method of claim 18, wherein the first metal oxide layer comprises at least one of: Tantalum Boro-oxide (TaBO), Tantalum Pentoxide ($Ta_2O_5$), Ruthenium oxide (RuO), Ruthenium Niobium Oxide (RuNbO), or Niobium Pentoxide ($Nb_2O_5$).

* * * * *